United States Patent
Wang et al.

(10) Patent No.: US 6,355,575 B1
(45) Date of Patent: Mar. 12, 2002

(54) SEMICONDUCTOR DEVICE AND METHOD OF MANUFACTURING WITHOUT DAMAGING HSQ LAYER AND METAL PATTERN

(75) Inventors: Fei Wang, San Jose; Simon S. Chan, Saratoga; Susan Chen, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/575,463

(22) Filed: May 22, 2000

Related U.S. Application Data

(62) Division of application No. 09/206,951, filed on Dec. 8, 1998, now Pat. No. 6,140,706.

(51) Int. Cl.$^7$ ............................. H01L 21/302
(52) U.S. Cl. ..................................... 438/712
(58) Field of Search ........................................ 438/712

(56) References Cited

U.S. PATENT DOCUMENTS

| | | |
|---|---|---|
| 5,780,161 A | 7/1998 | Hsu |
| 5,866,945 A | 2/1999 | Chen et al. |
| 6,140,706 A * | 10/2000 | Wang et al. ................ 257/775 |

* cited by examiner

Primary Examiner—Felisa Hiteshew

(57) ABSTRACT

HSQ is employed as a dielectric layer in manufacturing a high density, multi-metal layer semiconductor device. The degradation of deposited HSQ layers during formation of the semiconductor device, as from photoresist stripping using an $O_2$-containing plasma, is avoided by forming first and second dielectric layers on the HSQ layer, forming a photoresist mask on the second dielectric layer and etching to form an opening in the second dielectric layer leaving the first dielectric layer exposed. The first dielectric layer protects the HSQ from degradation during subsequent stripping.

12 Claims, 1 Drawing Sheet

SEMICONDUCTOR DEVICE AND METHOD OF MANUFACTURING WITHOUT DAMAGING HSQ LAYER AND METAL PATTERN

This application is a divisional of application Ser. No. 09/206,951 filed Dec. 8, 1998 now U.S. Pat. No. 6,140,706.

TECHNICAL FIELD

The present invention relates to a high density semiconductor device with reliable interconnection patterns. The present invention has particular applicability in manufacturing high density semiconductor devices with a design rule of about of 0.18 microns and under.

BACKGROUND ART

The escalating demands for high density and performance associated with ultra large scale integration semiconductor devices require a design rule of 0.25 microns and under, such as 0.18 microns, increased transistor and circuit speeds, high reliability and increased manufacturing throughput. The reduction of design rules to 0.25 microns and under generates significant challenges to the limitations of conventional interconnection technology, including conventional photolithographic, etching and deposition techniques.

Hydrogen silsesquioxane (HSQ) offers many advantages for use in interconnect patterns as a dielectric layer. HSQ is a highly desirable dielectric material. One form of HSQ is commercially available from Dow Corning Corp. under the product name Flowable Oxide™ or $FO_x$™. However, the use of HSQ presents problems, particularly when plasma etching is conducted. When a photoresist mask is deposited and the through-hole is etched to expose a portion of the HSQ layer, the photoresist mask is then stripped, typically employing an oxygen $O_2$-containing plasma Assessments of the feasibility of employing HSQ as a dielectric layer in interconnection patterns revealed that the $O_2$-containing plasma employed to strip the photoresist mask degraded the HSQ layer.

HSQ typically contains between about 70% and about 90% Si—H bonds. However, upon exposure to an $O_2$-containing plasma, a considerable number Si—H bonds are broken and Si—OH bonds are formed. Upon treatment with an $O_2$-containing plasma, as much as about 20% to about 30% of the Si—H bonds in the deposited HSQ film remained. In addition, exposure to an $O_2$-containing plasma increased the moisture content of the deposited HSQ film and its propensity to absorb moisture. An HSQ film having reduced Si—H bonds and high Si—OH bonds tends to absorb moisture from the ambient, which moisture outgases during subsequent barrier metal deposition. Thus, during subsequent barrier and metal deposition, outgasing occurs thereby creating voids leading to incomplete electrical connection.

In copending application Ser. No. 08/951,592, filed on Oct. 16, 1997, a method is disclosed for restoring degradation of an HSQ film by exposure to an $H_2$-containing plasma to increase the number of Si—H bonds, to decrease the number of Si—OH bonds, and to decrease the propensity to absorb moisture. The disclosed treatment with an $H_2$-containing plasma enables the use of HSQ to gap fill metal lines and form borderless vias with improved reliability by reducing outgassing and, hence, void formation.

In view of the manifest advantages of HSQ, there exists a need to provide technology whereby HSQ can be employed as a dielectric layer in forming interconnection patterns in a semiconductor device. There also exists a need to form interconnection patterns employing HSQ as a dielectric layer with improved reliability and increased production throughput.

DISCLOSURE OF THE INVENTION

An advantage of the present invention is a method of manufacturing a high density, multi-metal layer semiconductor device with a design rule of about 0.18 microns and under having an interconnection pattern comprising an HSQ dielectric layer.

Another advantage of the present invention is a high density, multi-metal layer semiconductor device with a design rule of about 0.18 microns and under and an interconnection pattern comprising an HSQ dielectric layer.

Additional advantages of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

depositing a layer comprising hydrogen silsesquioxane (HSQ) containing Si—H bonds on a first conductive pattern comprising a first conductive feature;

forming a first dielectric layer on the HSQ layer;

forming a second dielectric layer on the first dielectric layer, forming a photoresist mask on the second dielectric layer;

etching to form an opening in the second dielectric layer leaving the first dielectric layer exposed; and, removing the photoresist.

Another aspect of the present invention is a semiconductor device comprising a first metal patterned layer comprising a first metal feature;

an HSQ layer formed on the first metal patterned layer, a first dielectric layer formed on the HSQ layer and the first metal patterned layer;

a second dielectric layer formed on the first dielectric layer, an opening formed through the second dielectric layer, the first dielectric layer and the HSQ layer exposing at least a portion of the first metal feature and, conductive material filling the through-hole to form a connection.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention enables the effective manufacture of high density, multi-metal layer semiconductor devices having a design rule of about 0.18 microns and under, employing an HSQ interdielectric layer without incurring adverse consequences stemming from HSQ degradation. For example, deposited HSQ undergoes degradation upon exposure to an $O_2$-containing plasma during resist stripping.

HSQ contains primarily Si—H bonds. However, HSQ is vulnerable to degradation during processing, whereby the number of Si—H bonds is significantly decreased. For example, exposure to an $O_2$-containing plasma during photoresist stripping can cause a reduction in the number of Si—H bonds of HSQ by about 20% to about 30%, with an increase in the number of Si—OH bonds. As a result, such degraded HSQ exhibits a propensity to pick up moisture from the ambient. During subsequent filling of a through-hole such absorbed moisture is outgassed, thereby creating voids and reducing device reliability.

In accordance with the present invention, the degradation of deposited HSQ, as from exposure to an $O_2$-containing plasma, is substantially prevented by protecting the HSQ layer from exposure to the plasma. Embodiments of the present invention comprise masking a deposited HSQ dielectric interlayer with at least one layer comprising a dielectric material, such as an oxide or nitride. It was found that degradation of HSQ can be prevented by employing a protective dielectric material during $O_2$-containing plasma treatment as in removing a photoresist mask. Consequently, the HSQ layer in accordance with the present invention does not exhibit a significant propensity to absorb moisture from the ambient. Accordingly, outgassing and voids do not occur upon subsequent filling a through-hole with conductive material.

The present invention comprises depositing a layer comprising hydrogen silsesquioxane HSQ containing Si—H bonds on a semiconductor substrate on which active regions have been formed or on a first conductive pattern comprising a first conductive feature. A first dielectric layer is formed by conventional techniques on the HSQ layer. Then, a second dielectric layer is formed by conventional techniques on the first dielectric layer. The first and second dielectric materials may comprise an oxide such as silicon oxide, a nitride such as silicon nitride or titanium nitride, an oxynitride such as silicon oxynitride, or an oxime such as silicon oxime. For example, the first and second dielectric materials preferably comprise different materials, e.g., the first dielectric material can comprise an oxide, e.g., silicon oxide and the second dielectric material can comprise a nitride, e.g., silicon nitride.

Figure 1A:
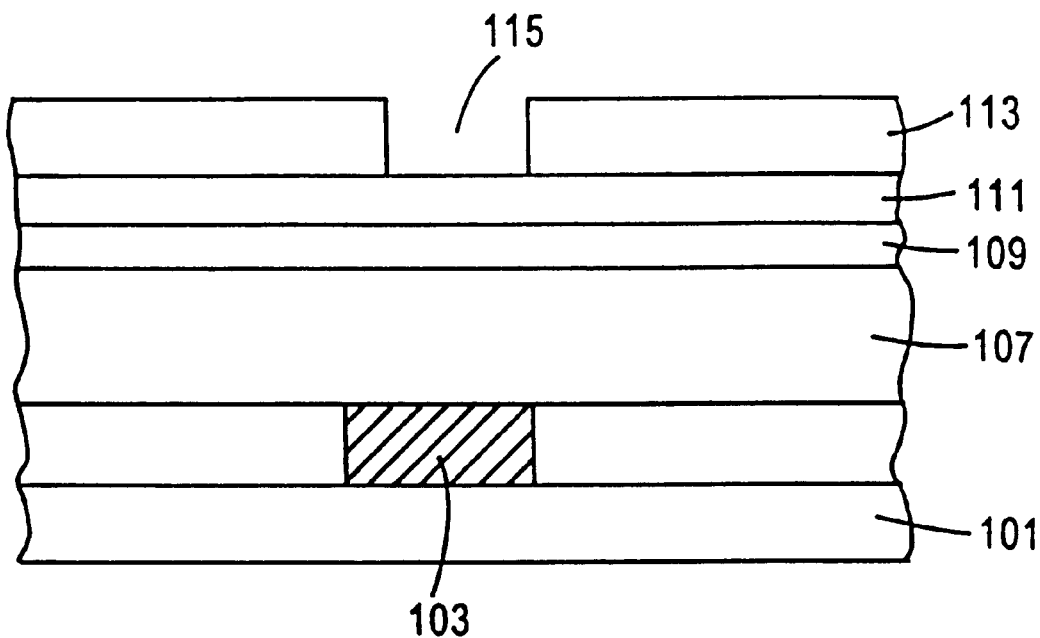
FIGS. 1A–1B schematically illustrates an embodiment of the present invention.
Figure 1B:
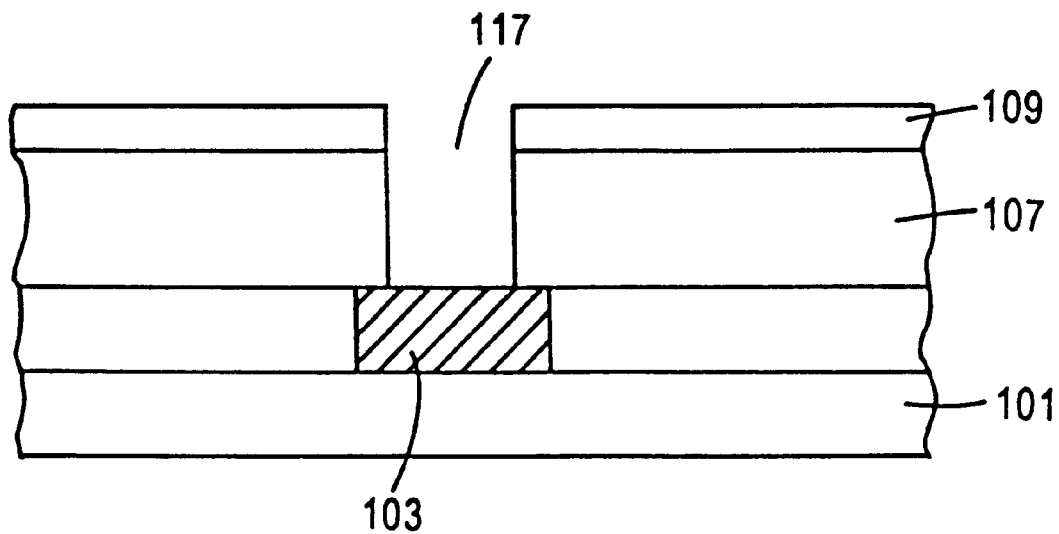

An embodiment of the present invention is schematically illustrated in FIGS. 1A–1B, wherein an underlying conductive feature 103 is formed on dielectric layer 101 by conventional techniques. The underlying conductive feature can, optionally, comprise an anti-reflective coating 105. It should be understood that the underlying feature can be a source/drain region formed in a semiconductor substrate. An HSQ dielectric layer 107 is deposited on the pattern including conductive feature 103. The present invention departs from conventional practices by forming a first dielectric layer 109 on the HSQ layer 107 and forming second dielectric layer 111 on the first dielectric layer 109.

A photoresist mask 113 is then formed on the second dielectric layer 111 and a hole 115 is formed in the second dielectric layer 111, as by anisotropic etching, topping on and exposing first dielectric layer 109. The photoresist mask 113 is then removed in a conventional manner, as with an $O_2$-containing plasma.

The first dielectric layer 109 protects the HSQ layer 107 from exposure to and, hence, degradation by the $O_2$-containing plasma during photoresist removal, such that the moisture content of the HSQ remains substantially unchanged after removal of the photoresist mask 113. In conventional methodology, the HSQ layer is unprotected and, hence, the HSQ layer is degraded during removal with an $O_2$-containing plasma.

Thus, embodiments of the present invention enable photoresist stripping such that the number of Si—H bonds in the HSQ layer before removal of the photoresist is substantially the same as the number of Si—H bonds after removal of the photoresist mask.

Thereafter, with reference to FIG. 1B, the remaining portion of the second dielectric layer 111 is removed, as by anisotropic etching, and a through-hole 117 is formed in the first dielectric layer 109, the HSQ layer 107, and the optional anti-reflective nitride coating 105 exposing at least a portion of the underlying conductive feature 103. When nitride coating 105 is present, both nitride coating 105 and the second dielectric layer 109 can be etched in a single step to expose at least a portion of a first metal feature 103.

In an another embodiment of the present invention, a remaining portion of the second dielectric layer is retained, the through-hole is filled with a conductive material and the conductive material is planarized by CMP using the second dielectric material as a stopping layer. Processing is then continued in accordance with conventional back end methodology. The present invention is applicable where the conductive features have been patterned by conventional methodology, damascene methodology and dual-damascene methodology via or contact openings and trench are simultaneously filled with conductive material.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the present invention and an example of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

depositing a layer comprising hydrogen silsesquioxane (HSQ) containing Si—H bonds on a first conductive pattern comprising a first conductive feature;

forming a first dielectric layer on the HSQ layer;

forming a second dielectric layer on the first dielectric layer;

forming a photoresist mask on the second dielectric layer;

etching to form an opening in the second dielectric layer leaving the first dielectric layer exposed; and, removing the photoresist.

2. The method according to claim 1, comprising removing the photoresist mask using an $O_2$-containing plasma.

3. The method according to claim 2, wherein the first and second dielectric materials comprise different materials.

4. The method according to claim 3, wherein the first dielectric layer comprises an oxide.

5. The method according to claim 4, wherein the second dielectric layer comprises a nitride, oxynitride or oxime.

6. The method according to claim 5, wherein the second dielectric layer comprises silicon nitride, titanium nitride, silicon oxynitride or silicon oxime.

7. The method according to claim 6, wherein the first dielectric layer protects the HSQ layer from degradation by the $O_2$-containing plasma during photoresist removal such that the moisture content of the HSQ layer remains substantially unchanged after removal of the photoresist mask.

8. The method according to claim 7, wherein the number of Si—H bonds in the HSQ layer before removal of the photoresist is substantially the same as the number of Si—H bonds after removal of the photoresist mask.

9. The method according to claim 2, further comprising:
   removing a remaining portion of the second dielectric layer; and
   forming a through-hole in the first dielectric layer and the HSQ layer exposing the first conductive feature.

10. The method according to claim 2, comprising:
    filling the through-hole with a conductive material; and
    planarizing the conductive material by chemical-mechanical polishing stopping on the second dielectric material.

11. The method according to claim 2, wherein the conductive layer comprises an upper antireflective nitride coating comprising:
    etching the second dielectric layer and an upper antireflective nitride coating in a single step to expose at least a portion of a first metal feature.

12. The method according to claim 1, wherein the opening further comprises a via or contact hole section communicating with a trench section.

* * * * *